United States Patent
Kawashima et al.

(10) Patent No.: US 6,807,729 B2
(45) Date of Patent: Oct. 26, 2004

(54) METHOD OF MANUFACTURING METAL FOIL

(75) Inventors: Toshiyuki Kawashima, Ibaraki (JP); Nobuharu Tahara, Ibaraki (JP); Kenichi Ikeda, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 4 days.

(21) Appl. No.: 10/170,798

(22) Filed: Jun. 11, 2002

(65) Prior Publication Data

US 2002/0189088 A1 Dec. 19, 2002

(30) Foreign Application Priority Data

Jun. 18, 2001 (JP) .......................... 2001-182922

(51) Int. Cl.[7] .............................................. H05K 3/20
(52) U.S. Cl. .......................... 29/831; 29/830; 29/851; 29/852
(58) Field of Search .......................... 29/830, 831, 851, 29/852; 156/230, 235, 241, 252, 253; 174/258, 259, 260

(56) References Cited

U.S. PATENT DOCUMENTS

| | | | |
|---|---|---|---|
| 4,180,608 A | * 12/1979 | Del | 428/196 |
| 4,751,146 A | * 6/1988 | Maeda et al. | 428/475.8 |
| 5,213,227 A | * 5/1993 | Koyama et al. | 220/359.3 |
| 5,349,155 A | 9/1994 | Yamagishi et al. | |
| 5,473,118 A | 12/1995 | Fukutake et al. | |
| 5,588,207 A | * 12/1996 | Kawakita et al. | 29/852 |
| 6,033,765 A | * 3/2000 | Takahashi et al. | 428/209 |
| 6,197,407 B1 | 3/2001 | Andou et al. | |
| 6,465,742 B1 | 10/2002 | Hiraoka et al. | |
| 2002/0015527 A1 | 2/2002 | Kawashima et al. | |
| 2002/0053465 A1 | 5/2002 | Kawakita, et al. | |

FOREIGN PATENT DOCUMENTS

| | | |
|---|---|---|
| EP | 0 331 429 A2 | 9/1989 |
| EP | 0 397 177 A2 | 11/1990 |
| EP | 0 645 951 A1 | 3/1995 |
| EP | 0 768 334 A2 | 4/1997 |
| JP | 02181997 | 7/1990 |
| JP | 7-263828 | 10/1995 |
| JP | 9-324060 | 12/1997 |
| JP | 05021950 | 1/2003 |

* cited by examiner

Primary Examiner—Carl J Arbes
Assistant Examiner—Tai Van Nguyen
(74) Attorney, Agent, or Firm—Knobbe Martens Olson & Bear, LLP

(57) ABSTRACT

The present invention provides a method of manufacturing a metal foil laminated product including the steps of forming a bonding layer containing a thermosetting resin on a lower wiring layer, a metal layer or an insulating layer, provisionally bonding a porous layer having a releasing film attached thereto onto a surface of the bonding layer, peeling the releasing film from the porous layer, laminating a metal foil on the porous layer obtained after the peeling, and heating and pressurizing the laminated product to transfer the bonding layer to the metal foil and thereby integrating them. Furthermore, the present invention provides a method of manufacturing a wiring board comprising the steps of manufacturing a metal foil laminated product by the above manufacturing methods, and providing a pattern on the metal foil of the metal foil laminated product, thereby forming a wiring layer.

15 Claims, 6 Drawing Sheets

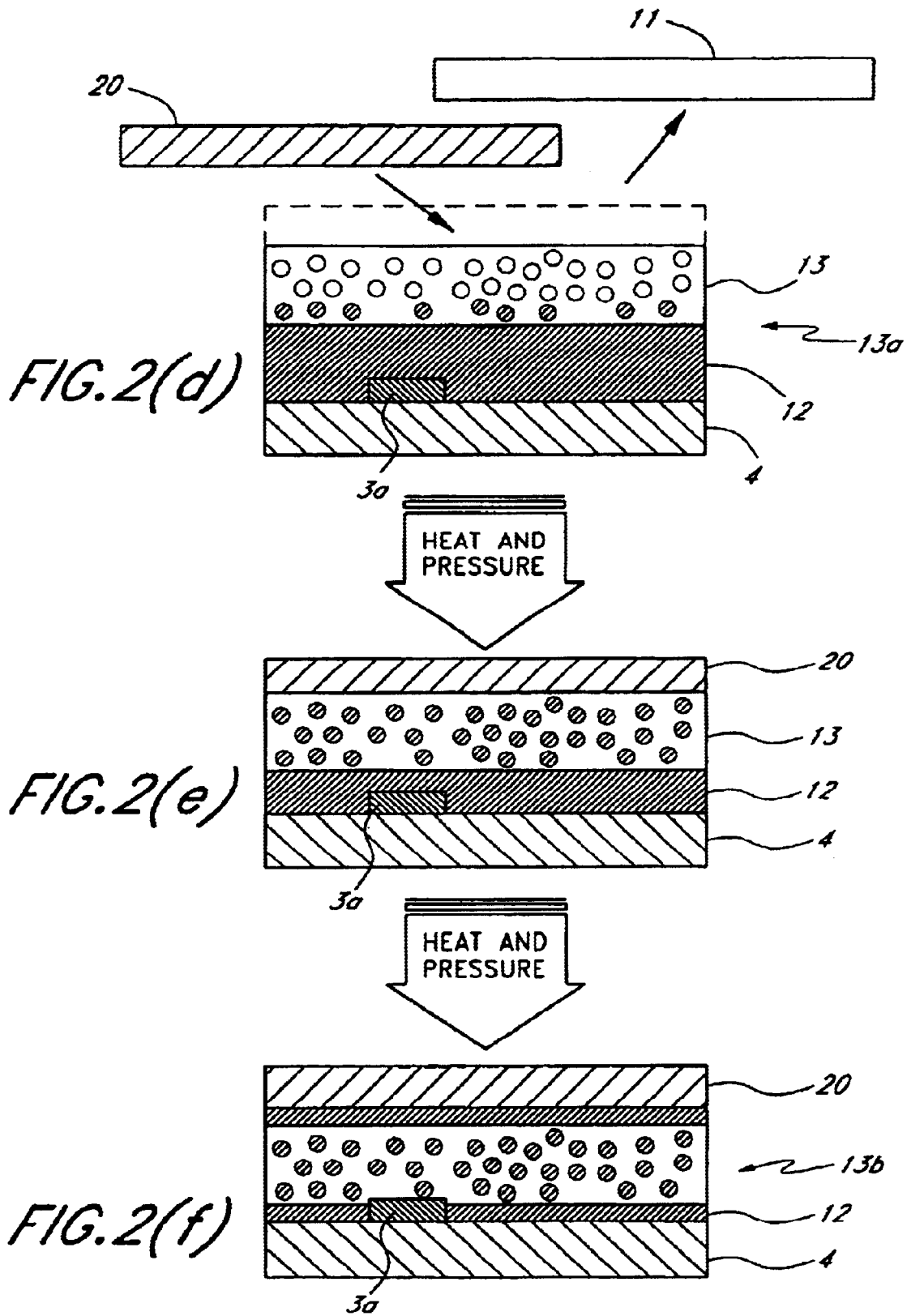

METHOD OF MANUFACTURING METAL FOIL

BACKGROUND OF THE INVENTION

1. Field of the Invention

The present invention relates to a method of manufacturing a metal foil laminated product in which a metal foil is laminated integrally, by utilizing a bonding layer, on a wiring layer provided with a wiring pattern or on a metal layer or an insulating layer which has no pattern and a method of manufacturing a wiring board, and more particularly to a useful technique for manufacturing a multilayer wiring board having a conductive connecting structure between wiring layers.

2. Description of the Related Art

In the steps of forming a core substrate, an insulating layer or the like of a printed wiring board to be used in electronic equipment or the like, conventionally, there has been used a prepreg in which a glass fiber fabric or a polymer nonwoven fabric is impregnated with a thermosetting resin and is half cured. The prepreg is thermally pressed together with copper foils provided on both surfaces, for example, so that a double-sided copper foils laminated plate can be obtained, and a wiring pattern is formed on the copper foil and can be thus used as the core substrate of a multilayer wiring board.

In recent years, the wiring board has a finer wiring pattern because of the high integration of a wiring, and furthermore, a multilayer structure is achieved and each layer is thinned. For this reason, in the case in which a glass fiber fabric impregnated with an epoxy resin is used for the prepreg, there is a problem in that drilling is carried out with difficulty due to a glass fiber when laser via processing is to be carried out. Therefore, there have been proposed various prepregs using, for a reinforcing phase, a polymer nonwoven fabric on which the laser via processing can be carried out more easily.

However, if an insulating layer is to be provided on a wiring layer having a wiring pattern formed thereon by utilizing a prepreg using a polymeric nonwoven fabric for a reinforcing phase, a wiring layer formed as an upper layer is not flat due to the irregularity of the wiring pattern or nonwoven fabric itself. Consequently, there is a problem in that a step of providing an upper layer which is to be subsequently carried out is impeded. In a multilayer wiring board in which each layer has a thickness reduced, particularly, there has been employed a method in which a thermosetting resin is applied in place of the provision of the prepreg or a thermosetting resin sheet is provided to form an insulating layer. In these methods, however, the reinforcing phase is not present. Therefore, it is hard to control a gap for forming the insulating layer. Thus, such a method is not advantageous to mass production.

On the other hand, there has also been known a prepreg using a porous film comprising aromatic polyamide in place of the polymeric nonwoven fabric (Japanese Laid-Open Patent Publication No. 9-324060). As described in the publication, generally, when a porous film is to be impregnated with a thermosetting resin, a resin is dissolved in a solvent to prepare a varnish, the porous film is coated and impregnated with the varnish, and the solvent is evaporated by heating and is thus half cured.

However, it has been found that the porous film is swollen by the solvent contained in the varnish or the porous film is deformed by a stress generated during the coating if the porous film is thus coated directly with the varnish, and a surface is wrinkled to easily generate irregularities, particularly in the case where a releasing film is particularly provided. As a result, when a conductive paste is to be applied into a via hole by screen printing after laser via processing, for example, there is a problem in that the screen printing cannot be carried out.

Therefore, it is an object of the present invention to provide a method of manufacturing a metal foil laminated product in which a metal foil laminated product having a flat surface can be formed and a gap for laminating a metal foil can easily be controlled so that mass production can be advantageously carried out and a problem is less caused by a solvent during the formation of a bonding layer, and a method of manufacturing a wiring board.

SUMMARY OF THE INVENTION

The above-mentioned object can be achieved by the present invention in the following manner.

A method of manufacturing a metal foil laminated product of the present invention comprises the steps of: forming a bonding layer containing a thermosetting resin on a lower wiring layer, a metal layer or an insulating layer; provisionally bonding a porous layer having a releasing film attached thereto onto a surface of said bonding layer; peeling said releasing film from said porous layer; laminating a metal foil on the porous layer obtained after the peeling; and heating and pressurizing the laminated product to transfer said bonding layer to said metal foil and thereby integrating them.

According to the method of manufacturing a metal foil laminated product of the present invention, a reinforcing material of a prepreg is formed by a porous layer. Therefore, a metal foil laminated product having a flat surface can be formed without generating irregularities by a reinforcing fibers, and the thickness of an insulating layer can be reduced by the porous layer so that a density can be increased in a thickness direction. Moreover, the porous layer has a function like a spacer. Therefore, the gap control of the insulating layer can easily be carried out by a pressurizing force, so that mass production can be achieved advantageously. Furthermore, a problem is less caused by a solvent during the formation of a bonding layer (an impregnated phase) as compared with the case in which a resin is previously impregnated in the hole of a porous film.

Another method of manufacturing a metal foil laminated product of the present invention comprises the steps of: forming a bonding layer containing a thermosetting resin on an insulating layer; forming a wiring layer having a pattern on a surface of the bonding layer; provisionaly bonding a porous layer having a releasing film attached thereto onto an exposed surface of said bonding layer via said wiring layer interposed therebetween; providing an opening reaching the wiring layer from said releasing film; filling the opening with a conductive paste; peeling the releasing film from the porous layer; laminating a metal foil on a surface where the peeling has been carried out; and heating and pressurizing the laminated product to transfer said bonding layer to the metal foil and thereby integrating them.

In this case, it is possible to obtain the above-mentioned functions and effects, and furthermore, to form a conductive connecting structure between the wiring layers by a conductive paste. In that case, the thickness of the insulating layer can be reduced, and therefore, the diameter size of an opening formed by a laser processing can be reduced so that a wiring pattern can become finer.

On the other hand, a method of manufacturing a wiring board of the present invention comprises the steps of: manufacturing a metal foil laminated product by the manufacturing method according to the above methods; and providing a pattern on the metal foil of the metal foil laminated product, thereby forming a wiring layer. According to the method of manufacturing a wiring board in accordance with the present invention, a metal foil laminated product having a flat surface can be formed by the above-mentioned functions and effects. In addition, a gap for laminating a metal foil can easily be controlled. Therefore, mass production can be achieved advantageously and a bonding layer can also be formed readily.

BRIEF DESCRIPTION OF THE DRAWINGS

FIGS. 2(a) to 2(f) are views showing a process for a method of manufacturing a wiring board according to a second embodiment of the present invention.

DETAILED DESCRIPTION OF THE PREFERRED EMBODIMENTS

Preferred embodiments of the present invention will be described below in order of first to third embodiments and a porous layer used for each embodiment with reference to the drawings. FIGS. 1(a) to 1(f), FIGS. 2(a) to 2(f), and FIGS. 3(a) to 3(f) are views corresponding to the first to third embodiments for a method of manufacturing a wiring board according to the present invention.

(First Embodiment)

Figure 1A:
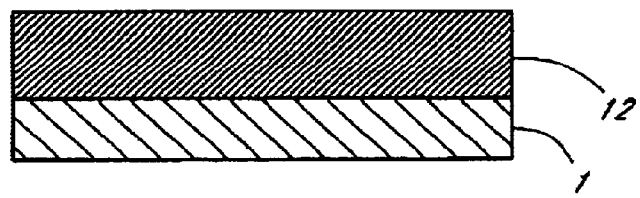
FIGS. 1(a) to 1(f) are views showing a process for a method of manufacturing a wiring board according to a first embodiment of the present invention.

A method of manufacturing a metal foil laminated product according to the invention comprises the step of forming a bonding layer 12 containing a thermosetting resin on a lower wiring layer, a metal layer 1 or an insulating layer as shown in FIG. 1(a). In the present embodiment, the bonding layer 12 is formed on the metal layer 1.

Examples of the metal layer 1 include copper, cupronickel, bronze, brass, aluminum, nickel, iron, stainless, gold, silver, platinum and the like. It is preferable that the metal layer 1 should have a thickness of 1 to 50 $\mu$m. In the present invention, it is particularly preferable that a copper foil suitable for the wiring pattern of a wiring board is used. In order to enhance an adhesion to the bonding layer 12, the surface of the metal foil may be subjected to various physical or chemical surfacing processes such as a rough surfacing process or a blacking process.

The bonding layer 12 contains a thermosetting resin. Preferably, the surface of the metal layer 1 is coated with a raw material composition of the thermosetting resin and a solvent is then dried to form a solid coating film by various coaters and the like. Consequently, a porous layer 13 to be provided later can be prevented from being swollen and deformed by the solvent contained in the raw material composition of the thermosetting resin. Accordingly, it is preferable that the amount of the solvent remaining in the bonding layer 12 should be reduced. In the present invention, the solvent may be contained in an amount of 10% by weight or less.

Examples of the thermosetting resin include an epoxy resin, a phenol resin, a polyimide resin, polyamide acid and the like. The epoxy resin, a mixture of the epoxy resin and other resins and the like are preferable in respect of its cost and easiness of handling. The raw material composition of the thermosetting resin may contain a catalyst, a curing agent, a flame retardant, a filler, a plasticizer, an accelerator and the like in addition to the solvent. Examples of the solvent contained in the raw material composition of the thermosetting resin include ketones, acetate esters, ethers, aromatic hydrocarbons, alcohols and the like depending on the type of the thermosetting resin.

In order to coat the surface of the metal layer 1 with the raw material composition, it is possible to employ a method using a blade coater, a comma coater, a roll coater, a calendar coater and a bar coater. When a coating thickness becomes more uniform, the thickness of the solid coating film becomes more uniform and an amount of impregnation also becomes more uniform.

As for drying the solvent, the solvent does not need to be removed completely but may be non-fluidized. As a drying method, heating or hot air drying is preferable in respect of an efficiency. For a heating temperature, such a temperature as not to excessively progress the curing reaction of the thermosetting resin is selected. By the heating and drying, the bonding layer 12 containing the thermosetting resin is formed. However, the thermosetting resin is not cured completely but it is preferably fluidized by subsequent heating such that the porous layer 13 can be impregnated therewith. Such a state of the resin can be realized by properly regulating a drying temperature depending on the type of the thermosetting resin.

The thickness of the bonding layer 12 is almost determined by the thickness and vacancy rate of the porous layer 13 to be provided. It is preferable that the thickness of the bonding layer 12 should be regulated to obtain a volume (a volume per unit area) which is 0.5 to 5 times as large as a vacancy volume per unit area of the porous layer 13.

Figure 1B:
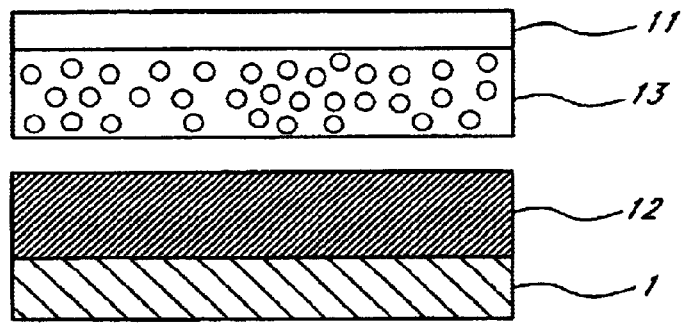
Figure 1C:
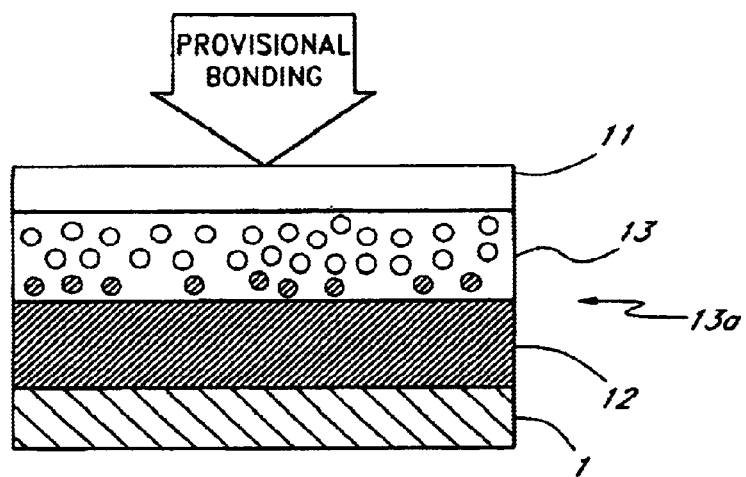

In the present invention, as shown in FIGS. 1(b) and 1(c), there is then performed the step of provisionally bonding the porous layer 13 having a releasing film 11 attached thereto onto the surface of the bonding layer 12. The porous layer 13 will be described below in detail.

Examples of the releasing film 11 include a polyester film such as polyethylene terephthalate or polyethylene naphthalate, a polyolefin film such as polyethylene or polypropylene, a polyamide film, a polyimide film and the like.

Examples of a method of attaching the releasing film 11 to the porous film 13 include a sticking method using static electricity, a method of using the releasing film 11 as a base material sheet during the formation of the porous layer 13, a separate bonding method using an adhesive and the like. The two former methods are preferable and the method of using the releasing film 11 as the base material sheet during the film formation is the most preferable.

For the method of provisionally bonding the porous layer 13 to the surface of the bonding layer 12, it is sufficient that pressure attaching is carried out by using the adhering force of the bonding layer 12. In order to reliably carry out the step of peeling the releasing film 11, it is preferable that the surface portion of the bonding layer 12 should be softened by heating and should be partially impregnated in the hole of the porous layer 13. Consequently, an impregnated portion 13a of the bonding layer 12 is formed. In that case, the provisionally bonding conditions can be properly regulated depending on the type of the thermosetting resin and the provisionally bonding can be carried out at a temperature of 100° C. or less and a pressure of 0.1 to 1 MPa, for example.

For the provisionally bonding, a laminator, a thermal laminator, a thermal presser and the like can be employed.

In that case, there is an advantage that a vacuum device does not need to be used because aeration or the like is less caused as compared with the case in which a prepreg is used.

Figure 1D:
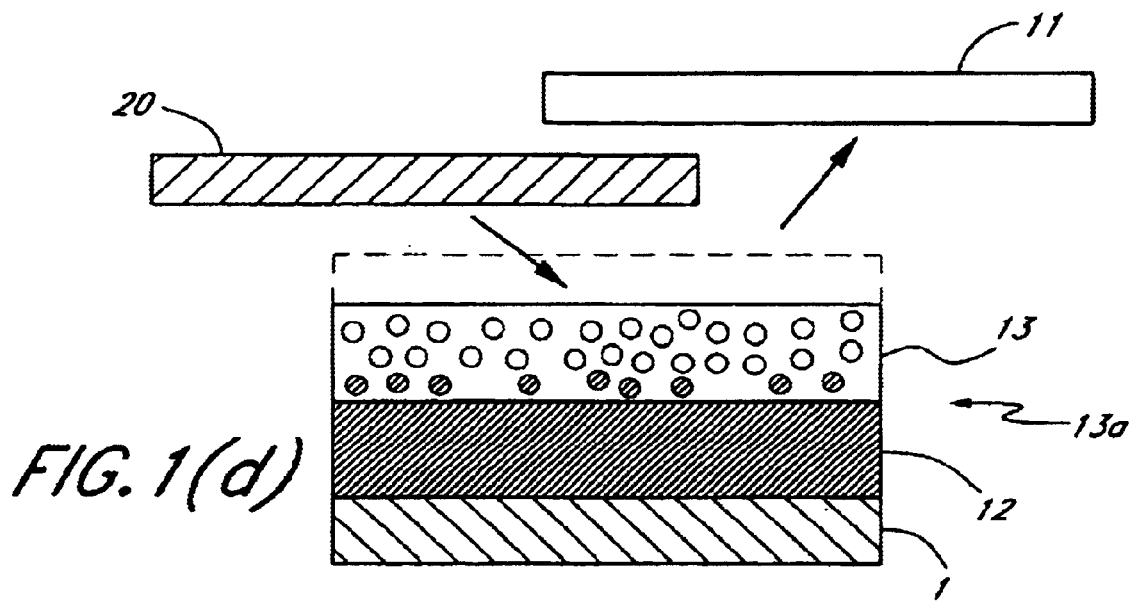

In the present invention, as shown in FIG. 1(d), the step of peeling the releasing film 11 from the porous layer 13 is then carried out. The releasing film 11 can be properly peeled by continuous winding, peeling to be started at a corner portion or the like.

In the present invention, as shown in FIG. 1(d), the step of providing a metal foil 20 on the porous layer 13 after the peeling is carried out. The metal foil 20 can be properly provided by a method of sucking and holding the metal foil 20 and delivering the metal foil 20 to a laminating position, a method of continuously winding and laminating the metal foil 20 and the like. The metal foil 20 may be the same as the metal layer 1.

Figure 1E:
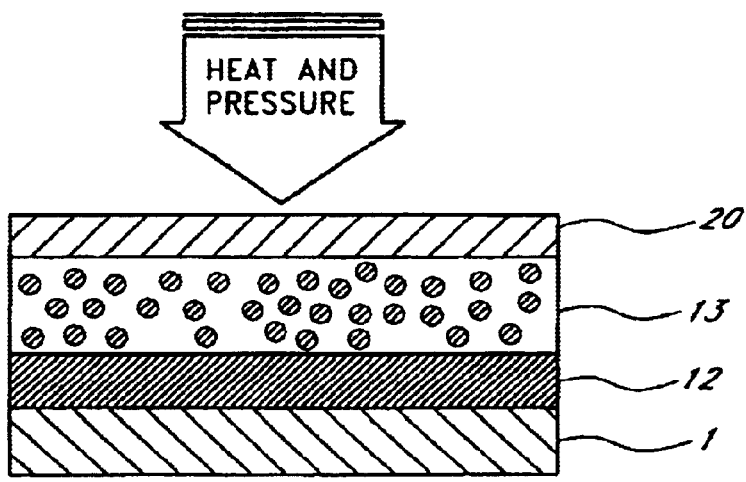
Figure 1F:
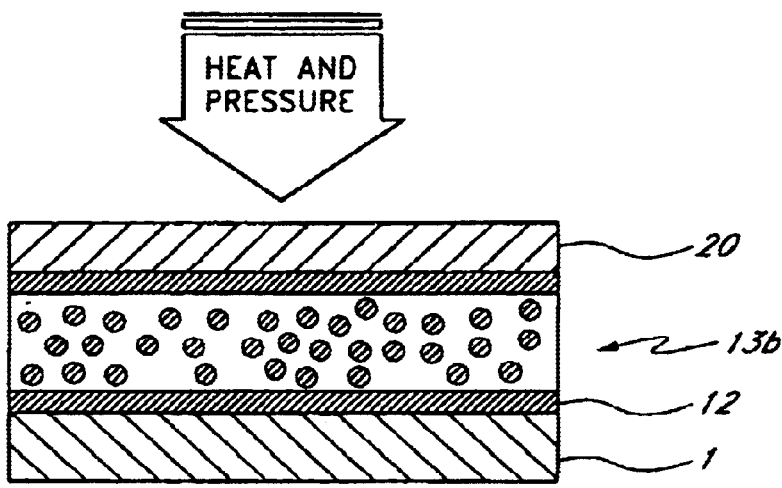

In the present invention, as shown in FIGS. 1(e) and 1(f), the step of heating and pressurizing a laminated product having the metal foil 20 provided thereon to transfer the bonding layer 12 to the metal foil 20 to be integrated is subsequently carried out. In other words, the bonding layer 12 is fluidized and impregnated in the porous layer 13 by heating and pressurization, and a metal foil laminated product having the metal foil 20 bonded and integrated is obtained by an impregnated insulating layer 13b. For the heating and pressurization, it is possible to use various pressers such as a vacuum presser, a thermal presser, a continuous presser and the like. Moreover, any of the well-known conditions corresponding to the type of the thermosetting resin can be applied to the temperature and pressure of the thermal press.

In the present invention, it is preferable to carry out the step of heating and pressurizing a laminated product to transfer the bonding layer 12 to the metal foil 20 and the step of curing the resin after the transferring on separate conditions. In that case, a temperature of 50 to 150° C., a pressure of 0.1 to 1 MPa and a time of 1 to 30 minutes are preferable for the former conditions and a temperature of 100 to 200° C., a pressure of 1 to 5 MPa and a time of 10 to 120 minutes are preferable for the latter conditions.

As described above, it is possible to manufacture a metal foil laminated product in which a metal foil is laminated integrally with the metal layer 1 through an insulating layer including porous phase. The method of manufacturing a wiring board of the present invention comprises the step of forming a pattern on the metal foil 20 of the metal foil laminated product thus obtained, thereby forming a wiring layer.

Any of the well-known methods can be used for a method of forming the pattern. For example, it is possible to use pattern etching by exposing and developing a dry film resist, a photosensitive resin coating film and the like. In the same manner, moreover, a pattern may be formed on the metal layer 1.

Moreover, it is also possible to form a conductive connecting structure in which respective wiring layers are conductively connected. In such a conductive connecting structure, it is possible to use any of a method of filling a conductive paste in a via hole, a method of plating the inside of the via hole and the like. Examples of a method of opening a via hole include a laser processing using various lasers such as a YAG laser and the like or drilling, a punch.

(Variant of First Embodiment)

While the example in which the bonding layer 12 is formed on the metal layer 1 has been described in the embodiment, the bonding layer 12 may be formed on a wiring layer 3 as in a second embodiment which will be described below, or an insulating layer.

Examples of the insulating layer include a resin layer reinforced by a glass fiber, a polymeric nonwoven fabric or a porous film, and examples of the resin include an epoxy resin, a phenol resin, a polyimide resin and the like. Moreover, the insulating layer may be ceramic. A wiring layer or the like may be formed under the insulating layer.

(Second Embodiment)

Figure 2A:
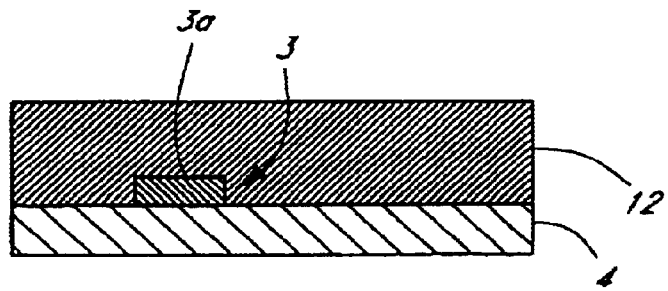
Figure 2B:
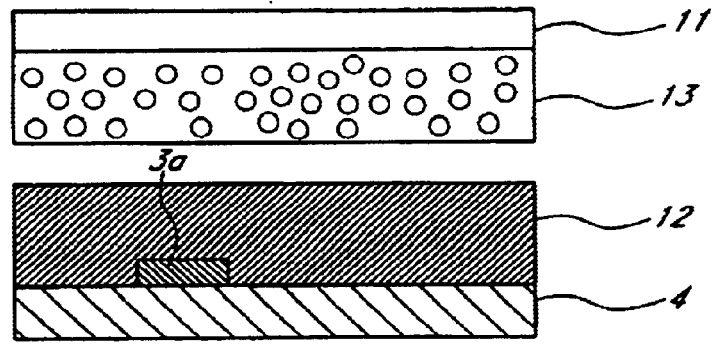
Figure 2C:
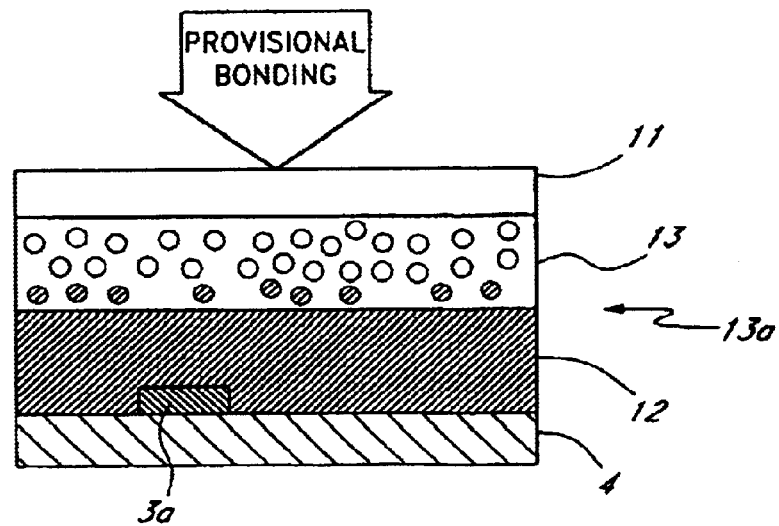

In the second embodiment, there will be described an example in which a bonding layer 12 is formed on a wiring layer 3 as shown in FIGS. 2(a) to 2(f). This example is different from the first embodiment in that a pattern portion 3a of the wiring layer 3 is partially embedded in a porous layer 13 as shown in FIG. 2(f). In the following, different portions from the first embodiment will be described below.

In the present invention, a porous film is used for a reinforcing phase in place of a nonwoven fabric. Therefore, it is possible to reduce the irregularities of the surface of a metal foil 20 by embedding the pattern portion 3a as described above.

For the wiring layer 3, the wiring pattern 3a may be formed on a core substrate or a wiring layer to be an upper layer may be used. The wiring pattern 3a is formed by pattern etching a metal foil laminated by using an etchant, pattern plating or the like, for example. For the etching, an etchant depending on the type of metal can be used. For the pattern etching, a dry film resist or the like can be used.

After or before forming a pattern on the metal foil 20 to provide a wiring layer, moreover, it is also possible to form a conductive connecting structure in which the wiring pattern 3a of the wiring layer 3 and the metal foil 20 are conductively connected between the layers. For such a conductive connecting structure, it is possible to employ a method of plating the inside of a via hole or the like. Examples of a method of opening a via hole include a laser processing using various lasers such as a YAG laser and the like or drilling, a punch.

(Third Embodiment)

In a third embodiment, as shown in FIGS. 3, there will be described an example in which a conductive connecting structure between the wiring layers is formed by a conductive paste when the metal foil laminated product is to be manufactured. Different portions from the first embodiment will be described below.

Figure 3A:
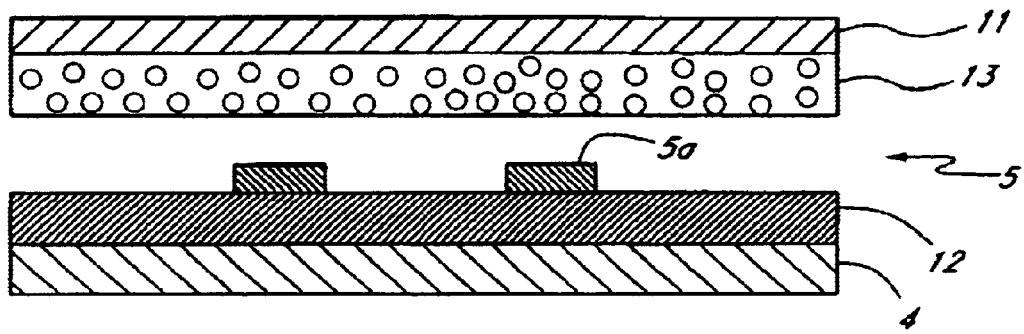
FIGS. 3(a) to 3(f) are views showing a process for a method of manufacturing a wiring board according to a third embodiment of the present invention.

As shown in FIG. 3(a), the present invention includes the step of forming a bonding layer 12 containing a thermosetting resin on an insulating layer 4, and the step of forming a wiring layer 5 having a pattern formed on the surface of the bonding layer 12. The bonding layer 12 can be formed in the same manner as in the first embodiment.

Examples of the insulating layer 4 include a resin layer reinforced by a glass fiber, a polymeric nonwoven fabric or a porous film, a resin layer containing no reinforcing material and the like, and examples of the resin include an epoxy resin, a phenol resin, a polyimide resin and the like. Moreover, the insulating layer may be ceramic or the like. A wiring layer or the like is formed under the insulating layer.

As a method of forming a pattern on the surface of the bonding layer 12, for example, it is preferable that a laminated and integrated metal foil should be subjected to pattern etching by an etchant or a wiring pattern 5a should be formed by pattern plating or the like. For the etching, an etchant can be used depending on the type of metal. For the pattern etching, a dry film resist or the like can be used.

Figure 3B:
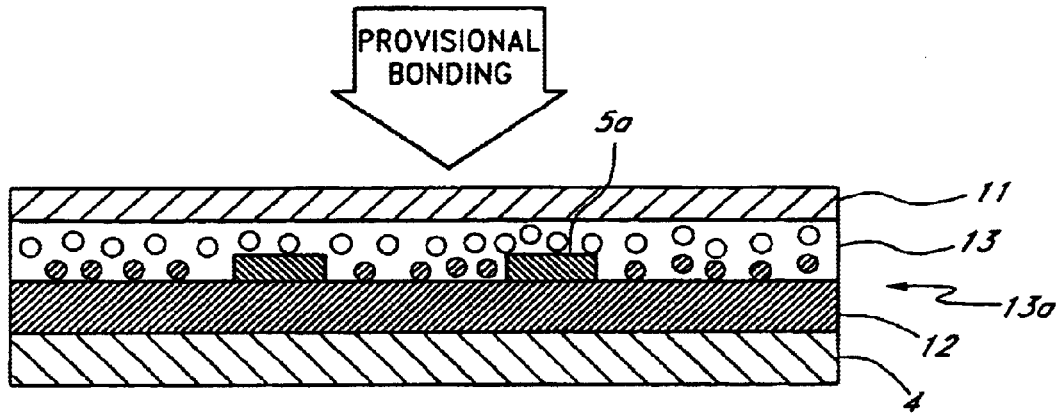

In the present invention, as shown in FIG. 3(b), the step of provisionally bonding a porous layer 13 having a releasing film 11 attached thereto onto the exposed surface of the bonding layer 12 via a wiring layer 5 interposed there between is then carried out. The provisionally bonding method, the porous layer 13 and the like are the same as those in the first embodiment.

Figure 3C:
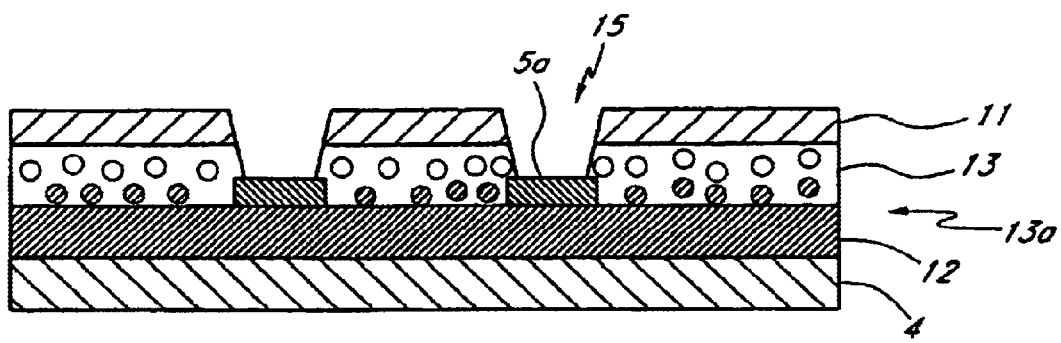

In the present invention, as shown in FIG. 3(c), the step of providing an opening 15 reaching the wiring layer 5 from the releasing film 11 is thereafter carried out. The step can be executed by a laser processing using various lasers such as a YAG laser. Any of conventional methods can be applied to the laser processing method, conditions and the like. The releasing film 11 also serves to protect the porous layer 13 to be a lower layer during the laser processing.

It is preferable that the diameter of the opening 15 should be approximately 10 to 300 $\mu$m in the releasing film 11 portion. Moreover, the bottom face of the opening 15 can also be subjected to a desmear treatment such that the wiring pattern 5a of the wiring layer 5 is suitably exposed.

Figure 3D:
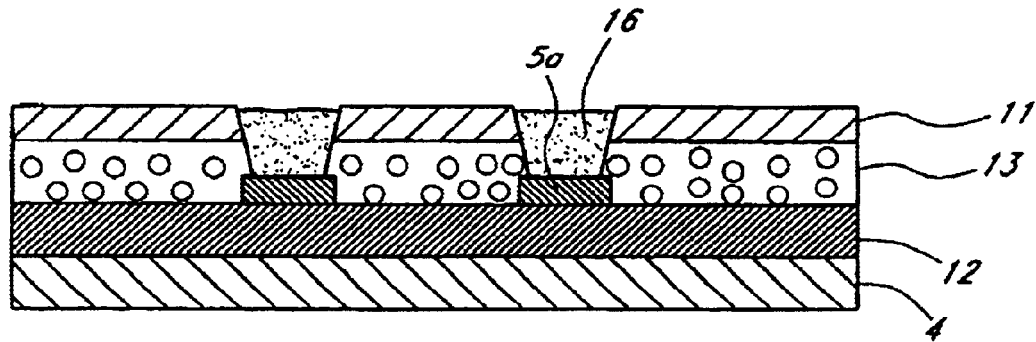

In the present invention, as shown in FIG. 3(d), the step of filling a conductive paste 16 in the opening 15 is then carried out. It is preferable that the conductive paste 16 should be filled in the opening 15 to have almost the same surface height as that of a surrounding portion. Examples of the conductive paste 16 include a product obtained by dispersing a conductive filler having particulates such as silver, copper, carbon or solder in a binder resin or a solvent. A thermosetting resin is suitably used for the binder resin and it is preferable that a curing reaction should progress by heating and pressurization. Moreover, the mean particle size of the particulate is generally 0.05 to 10 $\mu$m.

For filling the conductive paste 16, it is possible to use a method such as printing including screen printing, offset printing, pad printing, ink jet printing, bubble jet printing and the like or filling using squeeze.

Figure 3E:
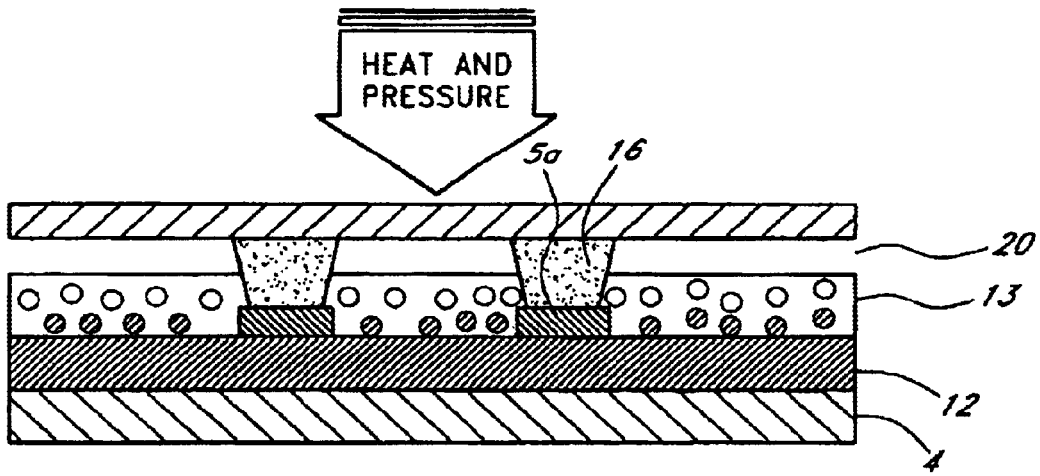

In the present invention, as shown in FIG. 3(e), the step of peeling the releasing film 11 from the porous layer 13 and the step of providing a metal foil 30 on a surface after the peeling are then carried out. Such steps are the same as those in the first embodiment.

Figure 3F:
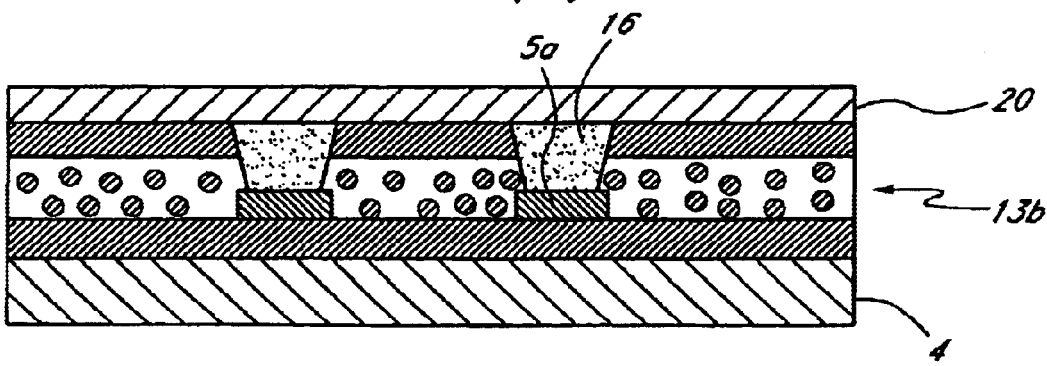

In the present invention, then, the step of heating and pressurizing a laminated product with the metal foil 30, so as to transfer the bonding layer 12 to a metal foil 20 and thereby integrating them is carried out as shown in FIG. 3(f). The lamination and the heating and pressurization may be carried out at the same time. By the steps, the metal foil 20 is laminated and integrated, and furthermore, the conductive paste 16 is pressed in contact so that the contact pressure of conductive paste 16 and the metal layer 1 and metal foil 20 is increased. Consequently, the reliability of conduction between the wiring layers can be enhanced.

(Variant of Third Embodiment)

(1) While the example in which the porous layer is provisionally bonded to the exposed surface of the bonding layer and the opening reaching the wiring layer from the releasing film is then provided has been described in the embodiment, it is also possible to provide an opening penetrating through the releasing film and the porous layer and to then provisionally bond the porous layer to the exposed surface of the bonding layer. The present embodiment is also included in the present invention including the step of forming a bonding layer containing a thermosetting resin on an insulating layer, the step of provisionally bonding a porous layer having a releasing film attached thereto onto the surface of the bonding layer, the step of peeling the releasing film from the porous layer, the step of laminating a metal foil in the porous layer obtained after the peeling, and the step of heating and pressurizing the laminated product to transfer the bonding layer to the metal foil and thereby integrating them.

(2) In above-mentioned embodiment, there has been described the example in which the bonding layer 12 is formed on only one of the surfaces of the insulating layer 4 and the metal foil 20 is then laminated. In the present invention, the bonding layer 12 is formed on both surfaces of the insulating layer 4 and the subsequent steps are carried out in the same manner. Consequently, it is possible to manufacture a metal foil laminated product and a multilayer wiring board with such a lamination structure that both upper and lower layers are almost symmetrical with each other.

In place of one insulating layer, moreover, two insulating layers are provided on a core board having a pattern formed thereon and a bonding layer is formed on both surfaces thereof, and the subsequent steps are carried out in the same manner. Consequently, it is possible to manufacture a metal foil laminated product and a multilayer wiring board with such a lamination structure that both upper and lower layers are almost symmetrical with each other.

(Porous Layer)

A resin having an excellent heat resistance and a high mechanical strength is preferable for the material of the porous layer to be used in the present invention, and it is possible to employ various resins such as polyimide, polyester, polyamide, particularly, aromatic polyamide, polyamideimide, polyetherimide and polyether sulfone. Above all, a polyimide based resin is preferable because of an excellent insulating property and heat resistance and an excellent adhesion with a metal layer. Moreover, the aromatic polyamide is preferable because of an excellent insulating property and heat resistance and a lower coefficient of thermal linear expansion.

While a single porous film may be used for the porous film, a film formed on the surface of a releasing film may be used. In particular, aromatic polyamide has a high adhesion to a polyester film during film formation, which can be exactly used as the releasing film.

Examples of the method of forming a porous film include a wet coagulation process, a dry coagulation process and a drawing process. In order to obtain a sponge structure, the wet coagulation process is preferable. In the wet coagulation process, generally, a film forming solution (dope) having a resin and an additive dissolved in a solvent is prepared and is applied (cast) to a film forming base material, and is then immersed in a coagulating solution to carry out solvent substitution. Consequently, the resin is coagulated (changed into a gel) and the coagulating solution is then dried and removed. Thus, the porous film is obtained.

The polyamide based resin mainly including a repetition unit in which an acid residue and an amine residue are imides bonded may contain other copolymerized components and blended compounds. In respect of a heat resistance, a hydroscopic property and a mechanical strength, polyimide having an aromatic group as a main chain, for example, polyimide composed of a polymerized product containing a tetracarboxylic acid component and an aromatic diamine component can be employed. In particular, it is desirable that a polymer having a limiting viscosity of 0.55 to 3.00, preferably, 0.60 to 0.85 (a measured value at 30° C.) can be used. In the case in which a porous film is to be formed by the wet coagulation process, the polymer having the limiting viscosity within the above range can be formed into a porous film having an excellent dissolving property in a solvent, a great mechanical strength and independence.

Referring to the polyamide based resin, a polymer or a precursor thereof (polyamide acid) can be used for film formation. The polyamide acid has an advantage that a molecular structure is less restricted because it has a more excellent dissolving property as compared with polyimide. While the polymer may be completely changed into imide, 70% or more of a change rate to imide is permitted. In the case in which a polymer having a comparatively high change rate to imide is used for doping, it is preferable to use a polymer including, in a repetition unit, a component having a high flexibility such as butanetetradicarboxylic anhydride.

Any solvent for dissolving the polyimide based resin or the precursor thereof can be used. It is preferable to use an aprotic polar solvent such as N-methyl-2-pyrrolidone, N,N-dimethylacetamide, N,N-dimethylformamide or dimethylsulfoxide in respect of a dissolving property and a solvent substitution speed for a coagulating solvent in the case in which a porous film is formed by the wet coagulation process. Preferable examples include N-methyl-2-pyrrolidone. Moreover, a solvent such as diethylene glycol, dimethyl ether or diethyleneglycol diethylether maybe mixed to regulate the speed of a solvent substitution in the wet coagulation process.

On the other hand, the aromatic polyamide includes so-called para type aramid and metha type aramid, and those in which a part of their main chain is substituted by diphenyl ether, diphenyl propane, diphenyl methane, diphenyl ketone, diphenyl sulfoxide or those in which biphenyl or a hydrogen group of an aromatic ring is substituted by a methyl group, a halogen atom or the like.

Examples of the para type aramid include poly p-phenyleneterephthalamide. The aramid thus constituted by only a rigid component is to be dissolved in a special reagent. For the aromatic polyamide used for the porous film, accordingly, it is preferable to at least partially use aramid having a part of main chain substituted by a component having a flexibility or the metha type aramid.

Examples of the component giving a flexibility include m-phenylene, 2,7-naphthalene, diphenyl ether, 2,2-diphenyl propane and diphenyl methane. Such components are used as a dicarboxylic monomer or a diamine monomer for copolymerization and is thus introduced into a bone structure. The component having a higher copolymerization ratio generally has a more excellent dissolving property for a solvent.

Examples of the solvent for dissolving the aromatic polyamide include tetramethyl urea, hexamethyl phospholamide, N,N-dimethyl acetamide, N-methyl-2-pyrrolidone, N-methylpiperidone-2, N,N-dimethylethylene urea, N,N,N',N'-tetramethyl allonic amide, N-methyl caprolactam, N-acetyl pyrrolidine, N,N-diethyl acetamide, N-ethyl pyrrolidone-2, N,N-dimethyl propionic amide, N,N-dimethyl isobutyl amide, N-methyl formamide, N,N-dimethyl propylene urea and their mixed systems. Furthermore, it is preferable to use an aprotic polar solvent such as N-methyl-2-pyrrolidone, N,N-dimethyl acetamide or N,N-dimethyl formamide in respect of a dissolving property and a solvent substitution speed for a coagulating solvent. More preferable examples include N-methyl-2-pyrrolidone.

Moreover, a solvent such as diethyleneglycol dimethy ether or diethyleneglycol diethyl ether or diethyleneglycol dibutyl ether may be mixed to regulate the speed of a solvent substitution.

Preferably, the doping in the wet coagulation process is carried out by application at a temperature of −20 to 40° C. Moreover, it is possible to use any coagulating solution which does not dissolve a resin to be used and has a compatibility with the solvent. For the coagulating solution, water, alcohols such as methanol, ethanol and isopropyl alcohol and their mixed solution can be used, particularly, the water can be used suitably. The temperature of the coagulating solution at time of immersion is not particularly restricted but a temperature of 0 to 90° C. is preferable.

The polymer concentration of a film forming solution preferably ranges from 5% by weight to 25% by weight, more preferably, 7% by weight to 20% by weight. If the concentration is too high, a viscosity is excessively increased and handling is hard to perform. If the concentration is too low, a porous film tends to be formed with difficulty.

In order to regulate a pore shape and a pore size, an in organic material such as lithium nitrate or an organic material such as polyvinyl pyrrolidone can also be added. It is preferable that the concentration of an additive should be 1% by weight to 10% by weight in a solution. If the lithium nitrate is added, the substitution speed of a solvent and a coagulating solution is increased and a finger void structure (a structure having a finger-like void) is formed in a sponge structure. When an additive for reducing a coagulation speed such as polyvinyl pyrrolidone is added, it is possible to obtain a porous film having a sponge structure expanded uniformly.

The dope is applied to have a constant thickness and is immersed in a coagulating solution such as water and is thus coagulated or is left in a water vapor atmosphere and is thus coagulated and is then immersed in the water. Thus, the solvent is removed so that a porous film is formed. After the porous film is formed, it is taken out of the coagulating solution and is then dried. A drying temperature is not particularly limited but is desirably 200° C. or less.

In the case in which a porous film of a polyimide based resin is formed using a precursor thereof (polyamide acid), heat treatment is finally carried out at 200 to 500° C. and the precursor (polyamide acid) is heated and ring-closed to form polyimide.

Referring to the porous film in the present invention, a back face or surface thereof preferably has a mean pore size of 0.05 μm or more, and more preferably, 0.1 to 5 μm in order to impregnate the porous film with a bonding layer. In order to suitably show the function of a reinforcing layer, the vacancy rate of the porous film is preferably 30 to 98%, and more preferably, 40 to 70%.

While the thickness of the porous film is not particularly restricted, a small thickness, a light weight and a great mechanical strength are desirable for a recent multilayer wiring board. Therefore, the thickness is preferably 90 μm to 5 μm.

What is claimed is:

1. A method of manufacturing a metal foil laminated product comprising the steps of:
    providing a bottom layer selected from the group consisting of a lower wiring layer, a metal layer and an insulating layer;
    forming on top of the bottom layer a bonding layer containing a thermosetting resin;
    provisionally bonding on top of the bonding layer a porous layer provided with a releasing film attached to top of the porous layer;
    peeling said releasing film from said porous layer;
    laminating a metal foil on the porous layer obtained after the peeling, wherein the porous layer is sandwiched by the metal foil and the bonding layer; and
    heating and pressurizing the laminated product to extend said bonding layer toward said metal foil through the porous layer, whereby the thermosetting resin of the bonding layer reaches the metal foil, and thereby integrating the laminated product.

2. The method of manufacturing a metal foil laminated product according to claim 1, wherein said porous layer is formed of polyimide or aromatic polyamide.

3. A method of manufacturing a wiring board comprising the steps of:
   manufacturing a metal foil laminated product by the manufacturing method according to claim 1; and
   providing a pattern on the metal foil of the metal foil laminated product, thereby forming a wiring layer.

4. The method of manufacturing a metal foil laminated product according to claim 1, wherein the provisionally bonding is carried out at a temperature of 100° C. or less and a pressure of 0.1 to 1 MPa.

5. The method of manufacturing a metal foil laminated product according to claim 1, wherein the provisionally bonding is conducted by using a laminator, a thermal laminator, or a thermal presser.

6. The method of manufacturing a metal foil laminated product according to claim 1, wherein the porous layer has a mean pore size of 0.1 to 5 μm.

7. A method of manufacturing a metal foil laminated product comprising the steps of:
   providing an insulating layer:
   forming on top of the insulating layer a bonding layer containing a thermosetting resin;
   forming on top of the bonding layer a wiring layer having a pattern;
   provisionally bonding on top of the wiring layer and an exposed surface of the bonding layer, a porous layer provided with a releasing film attached to top of the porous layer;
   providing an opening reaching the wiring layer from said releasing film;
   filling the opening with a conductive paste;
   peeling the releasing film from the porous layer;
   laminating a metal foil on a surface where the peeling has been carried out, wherein the porous layer is sandwiched by the metal foil and the bonding layer; and
   heating and pressurizing the laminated product to extend said bonding layer toward the metal foil through the porous layer, whereby the thermosetting resin of the bonding layer reaches the metal foil, and thereby integrating the laminated product.

8. The method of manufacturing a metal foil laminated product according to claim 7, wherein the porous layer is formed of polyimide or aromatic polyamide.

9. A method of manufacturing a wiring board comprising the steps of:
   manufacturing a metal foil laminated product by the manufacturing method according to claim 7; and
   providing a pattern on the metal foil of the metal foil laminated product, thereby forming a wiring layer.

10. The method of manufacturing a metal foil laminated product according to claim 7, wherein the provisionally bonding is carried out at a temperature of 100° C. or less and a pressure of 0.1 to 1 MPa.

11. The method of manufacturing a metal foil laminated product according to claim 7, wherein the provisionally bonding is conducted by using a laminator, a thermal laminator, or a thermal presser.

12. The method of manufacturing a metal foil laminated product according to claim 7, wherein the porous layer has a mean pore size of 0.1 to 5 μm.

13. The method of manufacturing a metal foil laminated product according to claim 7, wherein the filling of the conductive paste is conducted by using a screen printing, an offset printing, a pad printing, an ink jet printing, a bubble jet printing, or a squeeze.

14. A method of manufacturing a metal foil laminated product comprising the steps of:
   forming on top of a bottom layer a bonding layer containing a thermosetting resin;
   provisionally bonding on top of the bonding layer a porous layer provided with a releasing film attached to top of the porous layer;
   peeling the releasing film from the porous layer;
   laminating a metal foil on the porous layer obtained after the peeling, wherein the porous layer is sandwiched by the metal foil and the bonding layer; and
   extending the bonding layer toward the metal foil through the porous layer by heating and pressurizing the laminated product, wherein the thermosetting resin of the bonding layer migrates and reaches the metal foil, and thereby integrating the laminated product.

15. A method of manufacturing a metal foil laminated product comprising the steps of:
   forming on top of a bottom layer a bonding layer containing a thermosetting resin;
   forming on top of the bonding layer a patterned wiring layer;
   provisionally bonding on top of the patterned wiring layer and an exposed surface of the bonding layer where the patterned wiring layer is not formed, a porous layer provided with a releasing film attached to top of the porous layer;
   providing an opening reaching the wiring layer from said releasing film;
   filling the opening with a conductive material;
   peeling the releasing film from the porous layer;
   laminating a metal foil over the porous layer and the conductive material after the peeling, wherein the porous layer is sandwiched by the metal foil and the bonding layer; and
   extending the bonding layer toward the metal foil through the porous layer by heating and pressurizing the laminated product, wherein the thermosetting resin of the bonding layer migrates and reaches the metal foil, and thereby integrating the laminated product.

* * * * *